United States Patent
Odate

(10) Patent No.: US 10,676,118 B2
(45) Date of Patent: Jun. 9, 2020

(54) STEERING WHEEL UNIT

(71) Applicant: HONDA MOTOR CO., LTD, Minato-ku, Tokyo (JP)

(72) Inventor: Shotaro Odate, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 241 days.

(21) Appl. No.: 15/792,870

(22) Filed: Oct. 25, 2017

(65) Prior Publication Data
US 2018/0118247 A1    May 3, 2018

(30) Foreign Application Priority Data
Oct. 28, 2016   (JP) .................. 2016-211182

(51) Int. Cl.
| | | |
|---|---|---|
| B62D 1/04 | (2006.01) | |
| B60R 1/04 | (2006.01) | |
| B60R 16/02 | (2006.01) | |
| B62D 1/06 | (2006.01) | |
| G01D 5/24 | (2006.01) | |
| G01R 27/26 | (2006.01) | |

(52) U.S. Cl.
CPC ............. B62D 1/046 (2013.01); B60R 1/04 (2013.01); B60R 16/02 (2013.01); B62D 1/06 (2013.01); G01D 5/24 (2013.01); G01R 27/2605 (2013.01)

(58) Field of Classification Search
CPC . B62D 1/046; B62D 1/06; B62D 1/04; G01R 27/2605; G01D 5/24; B60R 16/02
USPC .................................................. 324/658–690
See application file for complete search history.

(56) References Cited

U.S. PATENT DOCUMENTS

| | | | |
|---|---|---|---|
| 6,836,267 B1* | 12/2004 | Endo .................. | G06F 3/03547 345/174 |
| 9,267,809 B2* | 2/2016 | Karasawa .......... | G01C 21/3664 |
| 2003/0189493 A1* | 10/2003 | Klausner ............... | B62D 1/046 340/575 |
| 2015/0367729 A1* | 12/2015 | Oda ....................... | B60K 35/00 701/36 |

(Continued)

FOREIGN PATENT DOCUMENTS

| | | |
|---|---|---|
| JP | 2011-033404 | 2/2011 |
| JP | 2012-199852 | 10/2012 |
| JP | 2013-122625 | 6/2013 |

(Continued)

OTHER PUBLICATIONS

Japanese Office Action for Japanese Patent Application No. 2016-211182 dated Mar. 20, 2018.

(Continued)

Primary Examiner — Jeff W Natalini
(74) Attorney, Agent, or Firm — Amin, Turocy & Watson, LLP

(57) ABSTRACT

Each of detection units detects electrostatic capacitance values Cc, Cr, Cl produced between sensors and a passenger H, based on electrical signals Sc, Sr, Sl outputted from the sensors, respectively. A total value calculation unit sums electrostatic capacitance values Cc, Cr, Cl to calculate a total value Ct of the electrostatic capacitance values Cc, Cr, Cl. A comparison determination unit compares the total value Ct with a first threshold value Cth1 to make a contact determination of whether the passenger H is in contact with a steering wheel.

3 Claims, 4 Drawing Sheets

(56) References Cited

U.S. PATENT DOCUMENTS

2016/0085338 A1\*  3/2016  Yasue ................... G06F 3/0416
                                                              345/174
2017/0166236 A1    6/2017  Iguchi et al.

FOREIGN PATENT DOCUMENTS

| JP | 2013-149199 | 8/2013 |
| JP | 2015-011771 | 1/2015 |
| JP | 2015-131544 | 7/2015 |
| JP | 2015-147531 | 8/2015 |
| JP | 2016-004632 | 1/2016 |

OTHER PUBLICATIONS

Japanese Office Action for Japanese Patent Application No. 2016-211182 dated Aug. 14, 2018.

\* cited by examiner

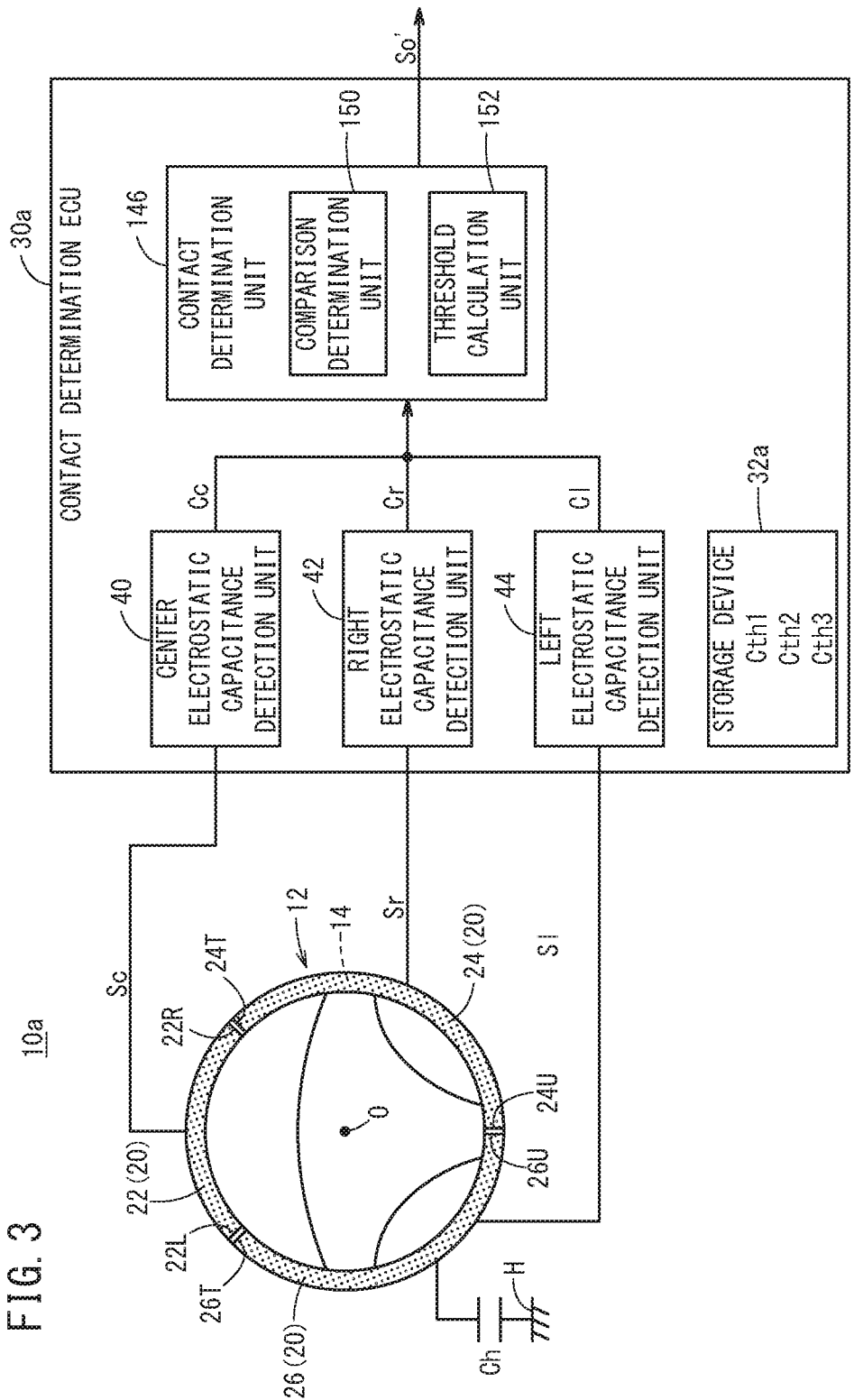

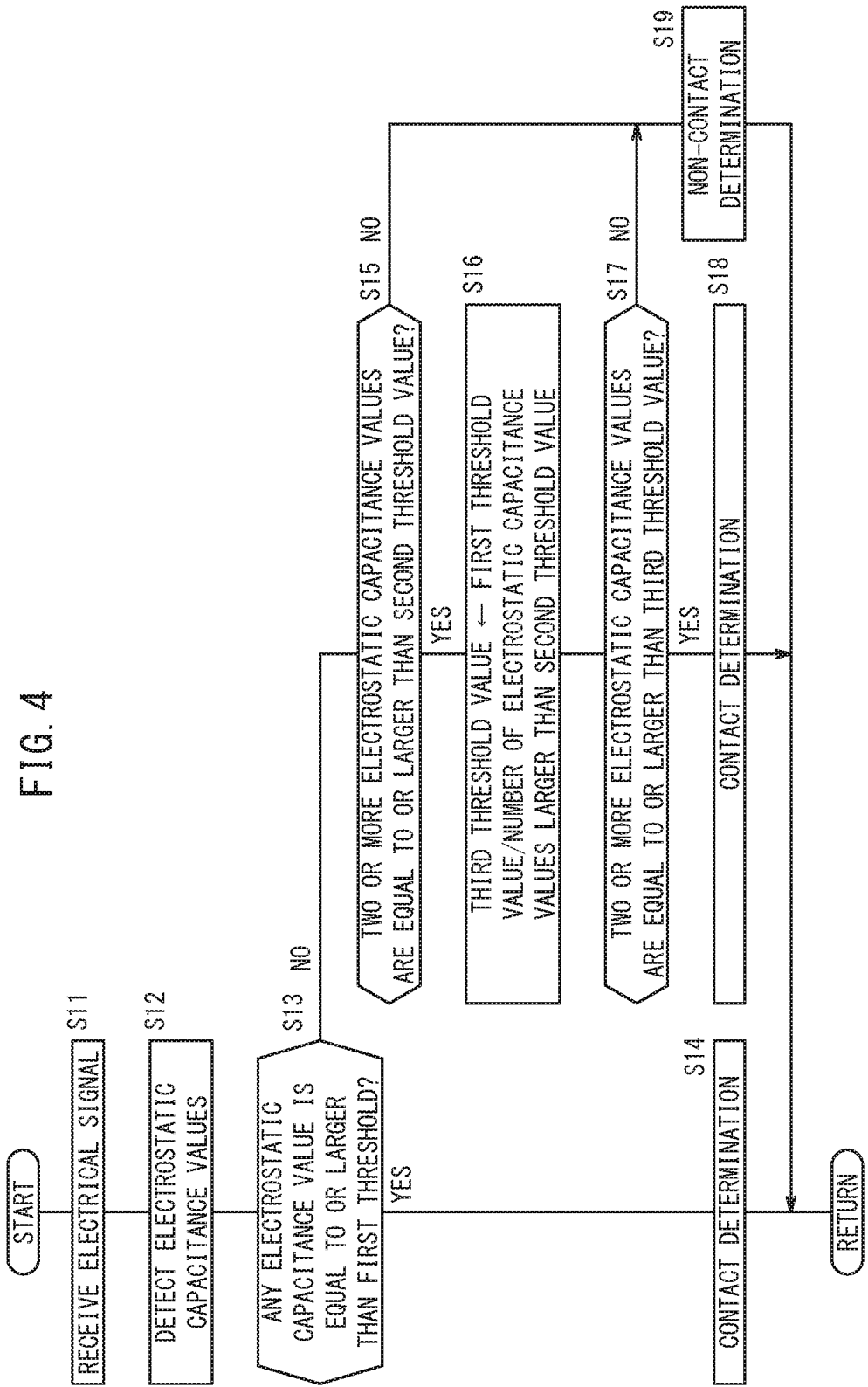

STEERING WHEEL UNIT

CROSS-REFERENCE TO RELATED APPLICATION

This application is based upon and claims the benefit of priority from Japanese Patent Application No. 2016-211182 filed on Oct. 28, 2016, the contents of which are incorporated herein by reference.

BACKGROUND OF THE INVENTION

Field of the Invention

The present invention relates to a steering wheel unit including a plurality of electrostatic capacitance type contact sensors provided for a steering wheel.

Description of the Related Art

Japanese Laid-Open Patent Publication No. 2015-147531 discloses a steering system where it is possible to detect a passenger's holding of a steering wheel, and the passenger's contact/non-contact with the steering wheel. This system includes a plurality of electrode parts provided along the circumferential direction of the cross section of a rim of the steering wheel. Each of the electrode parts is an electrostatic capacitance type contact sensor. When the passenger contacts the electrode parts, the electrode parts output electrical signals. This system calculates electrostatic capacitance values (hereinafter also referred to as the "electrostatic capacitance values of the contact sensors") produced between the contact sensors and the passenger, based on the electrical signals outputted from the individual contact sensors to determine the passenger's contact/non-contact with each of the contact sensors. Further, the system determines the passenger's contact state, based on the number of contact sensors that are determined as being in contact with the passenger.

In general, in the case of determining whether the passenger (human body) is in contact or not in contact with a contact sensor, an electrostatic capacitance value of the contact sensor is compared with a threshold value used for making a contact determination, and in the case where the electrostatic capacitance value is equal to or larger than the threshold value, it is determined that the passenger is in contact with the contact sensor. As the threshold value, a value is chosen that is close to an electrostatic capacitance value that is detected when the passenger contacts only one contact sensor.

SUMMARY OF THE INVENTION

For example, it is assumed that a plurality of contact sensors are provided for a steering wheel and a passenger holds the steering wheel with one hand. If an electrostatic capacitance value that is detected when one hand of the passenger contacts one contact sensor is compared with individual electrostatic capacitance values that are detected when the passenger contacts a plurality of contact sensors, the latter value is smaller than the former value. This situation occurs because electrical charges are dispersed into the plurality of contact sensors and thus the electrostatic capacitance values of the individual contact sensors decrease. Therefore, depending on the threshold value, it may not be possible to determine the contact state properly.

The present invention has been made taking account of the problems, and an object of the present invention is to provide a steering wheel unit that makes it possible to determine the contact state properly when a plurality of contact sensors are provided for a steering wheel.

In the first invention, a steering wheel unit includes a plurality of electrostatic capacitance type contact sensors provided for a steering wheel, and a contact determination device configured to determine whether a passenger is in contact with the steering wheel based on electrostatic capacitance values detected by the contact sensors and a threshold value. The contact determination device is configured to sum all of the electrostatic capacitance values, and if the total value of the electrostatic capacitance values is equal to or larger than the threshold value, the contact determination device determines that the passenger is in contact with the steering wheel.

In the first invention, even when the passenger contacts the plurality of sensors and the electrostatic capacitance values detected by the contact sensors are decreased, since the total value of all of the electrostatic capacitance values is compared with the threshold value, it is possible to determine the contact state properly. That is, even when the plurality of contact sensors are used, it is possible to make a contact determination using the threshold value which is close to the electrostatic capacitance value detected when the passenger contacts only one contact sensor.

In the first invention, if all of the electrostatic capacitance values are less than the threshold value, the contact determination device may sum all of the electrostatic capacitance values. In this system, when the passenger contacts only one contact sensor, it is possible to omit the process of summing all of the electrostatic capacitance values.

In the first invention, the contact determination device may sum all of the electrostatic capacitance values regardless of each of the electrostatic capacitance values. In this system, it is possible to omit the process of determining whether the passenger contacts only one contact sensor or contacts a plurality of contact sensors.

In the first invention, the contact determination device may compare each of the electrostatic capacitance values and the threshold value, and if there is any electrostatic capacitance value which is equal to or larger than the threshold value, the contact determination device may determine that the passenger is in contact with the steering wheel, and if there is no electrostatic capacitance value which is equal to larger than the threshold value, the contact determination device may sum all of the electrostatic capacitance values, and if the total value of the electrostatic capacitance values is equal to or larger than the threshold value, the contact determination device may determine that the passenger is in contact with the steering wheel. In this system, when the passenger contacts only one of the plurality of contact sensors, it is possible to make a contact determination quickly.

In the first invention, the threshold value may be a value that is smaller than a value of electrostatic capacitance produced between the one of the contact sensors and the passenger when the passenger contacts one of the contact sensors. In this system, it is possible to make a contact determination accurately.

In the second invention, a steering unit includes a plurality of electrostatic capacitance type contact sensors provided for a steering wheel and a contact determination device configured to determine whether a passenger is in contact with the steering wheel based on electrostatic capacitance values detected by the contact sensors and a first threshold value. If two or more of the electrostatic capacitance values are smaller than the first threshold value and are equal to or larger than a second threshold value which is larger than zero, the contact determination device switches the first threshold value to a third threshold value which is smaller than the first threshold value, and if two or more of the electrostatic capacitance values are equal to or larger than the third threshold value, the contact determination device determines that the passenger is in contact with the contact sensors.

In the second invention, even if the electrostatic capacitance values detected by the plurality of contact sensors when the passenger contacts the contact sensors are decreased, since each of the electrostatic capacitance values is compared with the third threshold value after the first threshold value is switched into the third threshold value which is smaller than the first threshold value, it is possible to determine the contact state properly. That is, even when the plurality of contact sensors are used, the first threshold value which is close to the electrostatic capacitance value detected when the passenger contacts only one contact sensor can be changed properly to make the contact determination.

In the second invention, the contact determination device may set, as the third threshold value, a numeric value calculated by dividing the first threshold value by the number of the electrostatic capacitance values that are equal to or larger than the second threshold value. In this system, it is possible to set the threshold value properly and determine the contact state accurately.

In the second invention, the first threshold value may be a value that is smaller than a value of electrostatic capacitance produced between the one of the contact sensors and the passenger when the passenger contacts one of the contact sensors. The second threshold value may be less than a value calculated by dividing, by the number of contact sensors, the value of electrostatic capacitance produced between the one of the contact sensors and the passenger when the passenger contacts one of the contact sensors. In this system, it is possible to make a contact determination accurately.

In the first invention and in the second invention, the contact detection device may detect the electrostatic capacitance values by an integration method or a charge transfer method. In this system, it is possible to detect the electrostatic capacitance value of each of the contact sensors properly.

In the present invention, in the case where the plurality of sensors are provided for the steering wheel, it is possible properly to determine the contact state of whether or not the passenger is in contact with the steering state.

The above and other objects features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 3 is a diagram showing a steering wheel unit according to a second embodiment;
and
FIG. 4 is a flow chart showing a contact determination process performed in the second embodiment.

DESCRIPTION OF THE PREFERRED EMBODIMENTS

Hereinafter, preferred embodiments of a steering wheel unit according to the present invention will be described in detail with reference to the accompanying drawings. The steering wheel unit is provided for a vehicle.

1. First Embodiment

[1.1 Structure of Steering Wheel Unit 10]

Figure 1:
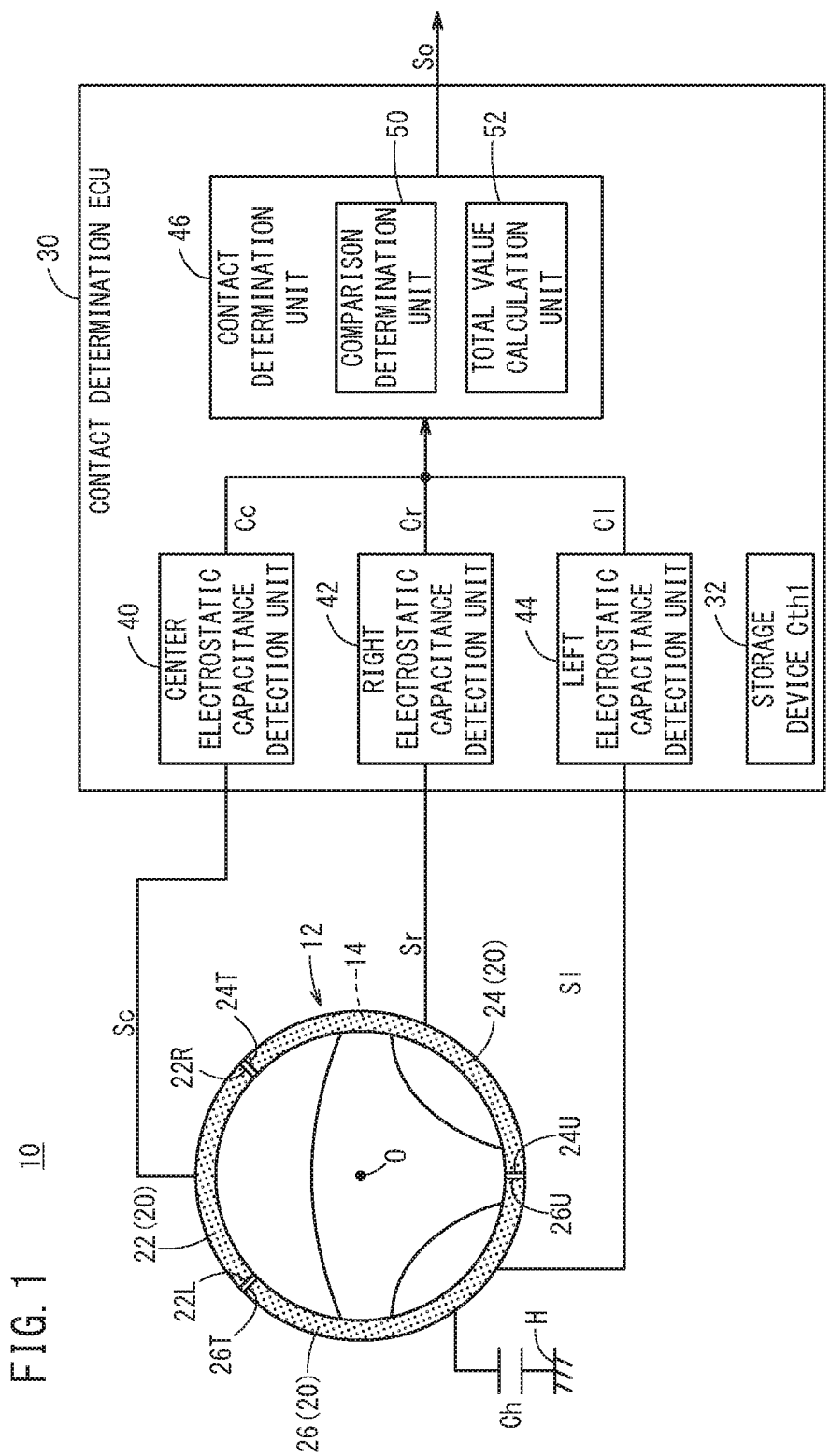
FIG. 1 is a diagram showing a steering wheel unit according to a first embodiment.

As shown in FIG. 1, a steering wheel unit 10 according to a first embodiment includes a steering wheel 12, contact sensors 20, and a contact determination ECU 30.

The steering wheel 12 includes an annular rim 14. The rim 14 has a layered structure including a plurality of layers in cross section. For example, the rim 14 includes an annular core metal, a resin member, and a leather member which are arranged in this order radially outward from the center in the cross-sectional view of the rim 14. The metal core serves as a frame of the rim 14. The resin member is formed in a substantially circular shape in cross section or an oval shape in cross section. The resin member has a thickness sufficient to cover the entire surface of the core metal, and defines the overall shape of the rim 14.

The leather member covers the entire surface of the resin member. The contact sensors 20 made of electrically conductive material (denoted by dots in FIG. 1) are formed on the surface of the leather member. Each of the contact sensors 20 is an electrode. The surface of the contact sensors 20 is coated with a non-insulating protective coating film. For example, the contact sensors 20 are formed by applying an electrically conductive coating on the entire outer circumference of the rim 14 in cross section (surface of the leather member). Each of the contact sensors 20 is an electrostatic capacitance type sensor.

The contact sensors 20 are separated into three parts. More specifically, three sensors are, as viewed from the front side of the steering wheel 12, a center sensor 22 provided on the upper side (hereinafter also referred to as the "sensor 22"), a right sensor 24 provided on the right side (hereinafter also referred to as the "sensor 24"), and a left side sensor provided on the left side (hereinafter also referred to as the "sensor 26"). In the state where the sensors 22, 24, 26 are insulated from each other, the sensors 22, 24, 26 are arranged in the axial direction of the rim 14, i.e., along a circle among those that are concentric about the center O of the rim 14. A right end 22R of the center sensor 22 is adjacent to an upper end 24T of the right sensor 24. A left end 22L of the center sensor 22 is adjacent to an upper end 26T of the left sensor 26. A lower end 24U of the right sensor 24 is adjacent to a lower end 26U of the left sensor 26. The contact sensors 20 need not be formed by an electrically conductive coating. The contact sensors 20 may be in the form of an electrically conductive sheet. Further, the contact sensors 20 may be separated into two, four, or more parts. When a passenger H contacts the steering wheel 12, the individual sensors 22, 24, 26 output electrical signals Sc, Sr, Sl indicating electrostatic capacitance values Cc, Cr, Cl, respectively. In the case where the passenger H does not contact the steering wheel 12, the sensors 22, 24, 26 output electrical signals Sc, Sr, Sl indicating stray capacitance values.

A contact determination ECU 30 is made up from one or a plurality of ECUs and includes a CPU (not shown), a storage device 32, etc. In the embodiment of the present invention, the CPU executes a program stored in a storage device 32 to perform each of function realization units 40, 42, 44, 46 which are described later. It should be noted that each of the function realization units 40, 42, 44, 46 may take a form of hardware including an integrated circuit, etc. The contact determination ECU 30 receives the electrical signals Sr, Sc, Sl outputted from the sensors 22, 24, 26, respectively, makes a contact determination of the passenger H's contact with the steering wheel 12, and outputs an electrical signal So indicating a determination result to another device (determination request device).

A center electrostatic capacitance detection unit 40 (hereinafter also referred to as the "detection unit 40") detects the electrostatic capacitance value Cc of the center sensor 22 based on the electrical signal Sc outputted from the center sensor 22. A right electrostatic capacitance detection unit 42 (hereinafter also referred to as the "detection unit 42") detects the electrostatic capacitance value Cr of the right sensor 24 based on the electrical signal Sr outputted from the right sensor 24. A left capacitance detection unit 44 (hereinafter also referred to as the "detection unit 44") detects the electrostatic capacitance value Cl of the left sensor 26 based on the electrical signal Sl outputted from the left sensor 26. Each of the detection units 40, 42, 44 (e.g., see Japanese Laid-Open Patent Publication No. 2015-147531 described above, and Japanese Laid-Open Patent Publication No. 2012-199852, etc.) adopts a known method such as an integration method or a charge transfer method to detect the electrostatic capacitance values Cc, Cr, Cl.

The contact determination unit 46 includes a comparison determination unit 50 and a total value calculation unit 52. The comparison determination unit 50 makes a contact determination by comparing each of the electrostatic capacitance values Cc, Cr, Cl detected by each of the detection units 40, 42, 44 and/or the total value Ct of the electrostatic capacitance values Cc, Cr, Cl (Ct=Cc+Cr+Cl), with a first threshold value Cth1. The total value calculation unit 52 calculates the total value Ct of the electrostatic capacitance values Cc, Cr, Cl.

The storage device 32 stores, in addition to various programs executed by the CPU, various numeric values used at the time of executing the programs. In this process, the storage device 32 stores the first threshold value Cth1. The first threshold value Cth1 is used for detecting that the passenger H is clearly in contact with the steering wheel 12, i.e., the passenger H is in contact with the steering wheel 12 to the extent that the passenger H can control the steering wheel 12. The first threshold value Cth1 is set to be smaller than a value of electrostatic capacitance produced between the one of the contact sensors 20 and the passenger H (hereinafter referred to as the electrostatic capacitance value Ch) when the passenger H contact one of the contact sensors 20. For example, the first threshold value Cth1 is set to be about 90% of the electrostatic capacitance value Ch.

[1.2 Contact Determination Process of First Embodiment]

Figure 2:
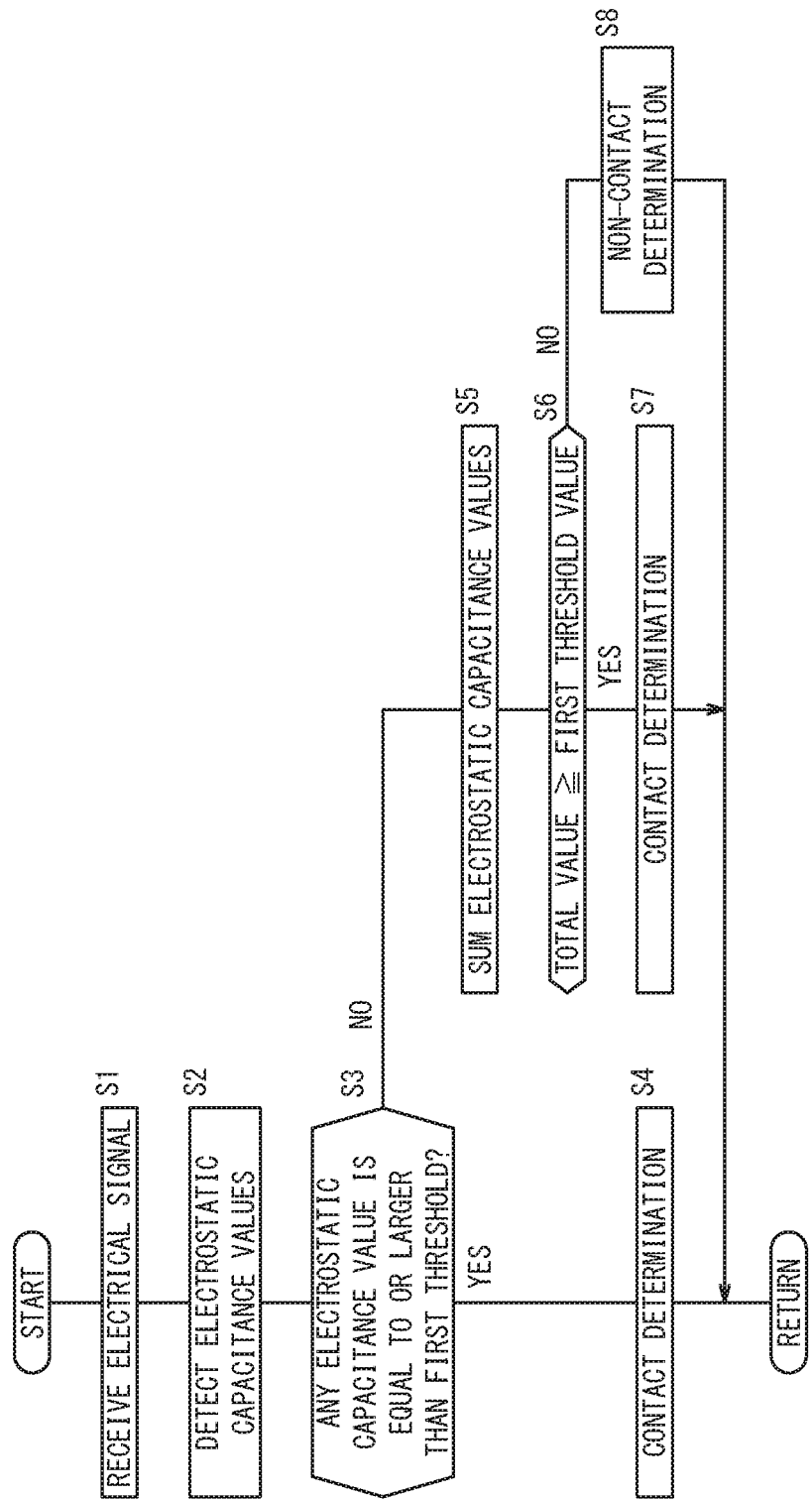
FIG. 2 is a flow chart showing a contact determination process performed in the first embodiment.

A contact determination process according to the first embodiment will be described with reference to FIG. 2. A series of processing described below is performed repeatedly at predetermined time intervals, mainly by the contact determination ECU 30. The electrostatic capacitance values Cc, Cr, Cl detected in the case where the passenger H contacts multiple sensors 22, 24, 26 are smaller than the electrostatic capacitance values Cc, Cr, Cl detected in the case where the passenger H contacts one of the sensors 22, 24, 26. The following series of processing utilizes this phenomenon.

In step S1, the contact determination ECU 30 receives the electrical signals Sc, Sr, Sl outputted from the sensors 22, 24, 26, respectively. In step S2, the detection units 40, 42, and 44 detect the respective electrostatic capacitance values Cc, Cr, Cl based on the electrical signals Sc, Sr, Sl.

In step S3, the comparison determination unit 50 compares each of the electrostatic capacitance values Cc, Cr, Cl with the first threshold value Cth1. Then, the comparison determination unit 50 determines whether any of the electrostatic capacitance values Cc, Cr, Cl is equal to or larger than the first threshold value Cth1. If the comparison determination unit 50 determines that any one of the electrostatic capacitance values Cc, Cr, Cl is equal to or larger than the first threshold value Cth1 (step S3: YES), i.e., if the passenger H contacts any one of the sensors 22, 24, and 26, the processing routine proceeds to step S4. If the comparison determination unit 50 determines that none of the electrostatic capacitance values Cc, Cr, Cl is equal to or larger than the first threshold value Cth1 (step S3: NO), i.e., if the passenger H contacts two or more of the sensors 22, 24, and 26, or the passenger H does not contact the sensors 22, 24, 26, the processing routine proceeds to step S5.

If the processing routine proceeds from step S3 to step S4, the comparison determination unit 50 determines that the passenger H is in contact with the steering wheel 12. The contact determination ECU 30 outputs an electrical signal So indicating a result of the contact determination (CONTACT: YES), to another device.

If the processing routine proceeds from step S3 to step S5, the total value calculation unit 52 calculates the total value Ct of all of the electrostatic capacitance values Cc, Cr, Cl. In step S6, the comparison determination unit 50 compares the total value Ct with the first threshold value Cth1. If the total value Ct is equal to or larger than the first threshold value Cth1 (step S6: YES), i.e., if the passenger H contacts two or more of the sensors 22, 24, 26, the processing routine proceeds to step S7. If the total value Ct is less than the first threshold value Cth1 (Step S6: NO), i.e., if the passenger H does not contact the sensors 22, 24, 26, the processing routine proceeds to step S8.

When the processing routine proceeds from step S6 to step S7, the comparison determination unit 50 determines that the passenger H has contacted the steering wheel 12. The contact determination ECU 30 outputs an electrical signal So indicating a result of the contact determination (CONTACT: YES), to another device.

When the processing routine proceeds from step S6 to step S8, the comparison determination unit 50 determines that the passenger H is not in contact with the steering wheel 12. The contact determination ECU 30 outputs an electrical signal So indicating a result of the contact determination (CONTACT: NO), to another device.

[1.3 Summary of First embodiment]

The steering wheel unit 10 includes the plurality of electrostatic capacitance sensors 22, 24, 26 (contact sensors) provided for the steering wheel 12, and the contact determination ECU 30 (contact determination device) for determining whether or not the passenger H is in contact with the steering wheel 12 based on the electrostatic capacitance values Cc, Cr, Cl detected respectively by the sensors 22, 24, 26, and the first threshold Cth1. The contact determination ECU 30 sums all of the electrostatic capacitance values Cc, Cr, Cl, and if the total value Ct all of the electrostatic capacitance values Cc, Cr, Cl is equal to or larger than the first threshold value Cth1, the contact determination ECU 30 determines that the passenger H is in contact with the steering wheel 12.

In the first embodiment, even when the passenger H contacts the plurality of sensors 22, 24, 26, and the electrostatic capacitance values Cc, Cr, Cl detected by the sensors 22, 24, and 26 are decreased, since the total value Ct of all of the electrostatic capacitance values Cc, Cr, Cl is compared with the first threshold value Cth1, it is possible to determine the contact state properly. That is, even when the plurality of sensors 22, 24, 26 are used, it is possible to make a contact determination using the first threshold value Cth1 which is close to the electrostatic capacitance value Ch detected in the case where the passenger H contacts only one contact sensor (one of the sensors 22, 24, 26).

If all of the electrostatic capacitance values Cc, Cr, Cl are less than the first threshold value Cth1 (step S3: NO), the contact determination ECU 30 sums all of the electrostatic capacitance values Cc, Cr, Cl (step S5). In this system, when the passenger H contacts only one of the contact sensors 22, 24, 26 (step S3: YES), it is possible to omit the process of summing all of the electrostatic capacitance values Cc Cr, Cl.

2 Second Embodiment

A second embodiment will be described with reference to FIGS. 3 and 4. Constituent elements of the second embodiment having structure identical to those of the first embodiment are labeled with the same reference numerals, and description thereof is omitted.

[2.1 Structure of Steering Wheel Unit 10a]

As shown in FIG. 3, a steering wheel unit 10a according to the second embodiment includes a steering wheel 12, contact sensors 20, and a contact determination ECU 30a.

The contact determination ECU 30a is made up from one ECU or a plurality of ECUs, and includes a CPU, a storage device 32a, etc. In the embodiment of the present invention, the CPU executes a program stored in a storage device 32a to realize each of function realization units 40, 42, 44, 146.

A contact determination unit 146 includes a comparison determination unit 150 and a threshold calculation unit 152. The comparison determination unit 150 compares each of electrostatic capacitance values Cc, Cr, Cl detected by each of detection units 40, 42, 44 with a first threshold value Cth1, a second threshold value Cth2, and a third threshold value Cth3 to make a contact determination and a contact position determination. The threshold calculation unit 152 calculates the third threshold value Cth3.

The storage device 32a stores, in addition to various programs executed by the CPU, various numeric values used at the time of executing the programs. In this process, the storage device 32 stores the first threshold value Cth1 and the second threshold value Cth2. The second threshold value Cth2 is used for detecting that there is a possibility that the passenger H contacts the steering wheel 12, i.e., the passenger H contacts the steering wheel 12 to the extent that the passenger cannot operate the steering wheel 12. As the second threshold value Cth2, a value is used that is smaller than the first threshold value Cth1 and larger than zero (stray capacitance value). In this regard, since the contact sensors 20 are separated in three parts, the second threshold value Cth2 needs to be less than ⅓ of the electrostatic capacitance value Ch.

[2.2 Contact Determination Process of Second Embodiment]

A contact determination process according to the second embodiment will be described with reference to FIG. 4. A series of processes described below are performed repeatedly at predetermined time intervals, mainly by the contact determination ECU 30a. The electrostatic capacitance values Cc, Cr, Cl detected when the passenger H contacts multiple sensors 22, 24, 26 are smaller than the electrostatic capacitance values Cc, Cr, Cl detected when the passenger H contacts one of the sensors 22, 24, 26. As in the case of the first embodiment, the following series of processes utilizes this phenomenon.

In step S11, the contact determination ECU 30a receives the electrical signals Sc, Sr, Sl outputted from the sensors 22, 24, 26, respectively. In step S12, the detection units 40, 42, and 42 detect the respective electrostatic capacitance values Cc, Cr, Cl based on the electrical signals Sc, Sr, Sl.

In step S13, the comparison determination unit 150 compares each of the electrostatic capacitance values Cc, Cr, Cl with the first threshold value Cth1. Then, the comparison determination unit 150 determines whether any of the electrostatic capacitance values Cc, Cr, Cl is equal to or larger than the first threshold value Cth1. If the comparison determination unit 150 determines that any one of the electrostatic capacitance values Cc, Cr, Cl is equal to or larger than the first threshold value Cth1 (step S13: YES), i.e., if the passenger H contacts one of the sensors 22, 24, and 26, the processing routine proceeds to step S14. If the comparison determination unit 150 determines that none of the electrostatic capacitance values Cc, Cr, Cl is equal to or larger than the first threshold value Cth1 (step S13: NO), i.e., if the passenger H contacts two or more of the sensors 22, 24, and 26, or the passenger H does not contact the sensors 22, 24, 26, the processing routine proceeds to step S15.

If the processing routine proceeds from step S13 to step S14, the comparison determination unit 150 determines that the passengers H is in contact with the steering wheel 12. Further, the comparison determination unit 150 identifies the sensors 22, 24, 26 corresponding to the electrostatic capacitance values Cc, Cr, Cl that are equal to or larger than the first threshold value Cth1. The identified sensors 22, 24, 26 correspond to contact positions. The contact determination ECU 30 outputs an electrical signal So' indicating a result of the contact determination (CONTACT: YES) and a result of the contact position determination (right, center, left), to another device.

When the processing routine proceeds from step S13 to step S15, the comparison determination unit 150 compares each of the electrostatic capacitance values Cc, Cr, Cl with the second threshold value Cth2. Then, the comparison determination unit 150 determines whether or not two or more of the electrostatic capacitance values Cc, Cr, Cl are equal to or larger than the second threshold value Cth2. If the comparison determination unit 150 determines that two or more of the electrostatic capacitance values are equal to or larger than the second threshold value Cth2 (step S15: YES), i.e., if there is a possibility that the passenger H may contact two or more of the sensors 22, 24, 26, the processing routine proceeds to step S16. If the comparison determination unit 150 determines it is not the case that two or more of the electrostatic capacitance values are equal to or larger than the second threshold value Cth2 (step S15, NO), i.e., if there is no possibility that the passenger H contact two or more of the sensors 22, 24, 26, the processing routine proceeds to step S19.

In step S16, the threshold calculation unit 152 calculates the third threshold value Cth3 by dividing the first threshold value Cth1 by the number of electrostatic capacitance values Cc, Cr, Cl that are larger than the second threshold value Cth2. That means, the first threshold value Cth1 is divided by the number of sensors 22, 24, 26 contacted by the passenger H.

In step S17, the comparison determination unit 150 compares each of the electrostatic capacitance values Cc, Cr, Cl with the third threshold Cth3. Then, the comparison determination unit 150 determines whether two or more of the electrostatic capacitance values Cc, Cr, Cl are equal to or larger than the third threshold value Cth3. If the comparison determination unit 150 determines that two or more of the electrostatic capacitance values Cc, Cr, Cl are equal to or larger than the third threshold value Cth3 (step S17: YES), i.e., if the passenger H contacts two or more of the sensors 22, 24, 26, the processing routine proceeds to step S18. If the comparison determination unit 150 determines it is not the case that two or more of the electrostatic capacitance values Cc, Cr, Cl are equal to or larger than the third threshold value Cth3 (step S17: NO), i.e., if the passenger H does not touch two or more of the sensors 22, 24, 26, the processing routine proceeds to step S19.

If the processing routine proceeds from step S17 to step S18, the comparison determination unit 150 determines that the passenger H is in contact with the steering wheel 12. Further, the comparison determination unit 150 identifies the sensors 22, 24, 26 corresponding to the electrostatic capacitance values Cc, Cr, Cl that are equal to or larger than the third threshold value Cth3. The identified sensors 22, 24, 26 correspond to contact positions. The comparison determination ECU 30 outputs an electrical signal So' indicating a result of the contact determination (CONTACT: YES) and a result of the contact position determination (right, center, left), to another device.

If the processing routine proceeds from step S15 or step S17 to step S19, the comparison determination unit 150 determines that the passenger H is not in contact with the steering wheel 12. The contact determination ECU 30 outputs an electrical signal So' indicating a result of the contact determination (CONTACT: NO), to another device.

[2.3 Summary of Second Embodiment]

The steering wheel unit 10a includes the plurality of electrostatic capacitance sensors 22, 24, 26 (contact sensors) provided for the steering wheel 12, and the contact determination ECU 30a (contact determination device) for judging whether or not the passenger H is in contact with the steering wheel 12 based on the electrostatic capacitance values Cc, Cr, Cl detected respectively by the sensors 22, 24, 26, and the first threshold Cth1. If two or more of the electrostatic capacitance values Cc, Cr, Cl are smaller than the first threshold value Cth1 and are equal to or larger than the second threshold value Cth2 which is larger than zero, the contact determination ECU 30a switches from the first threshold value Cth1 to the third threshold value Cth3 which is smaller than the threshold value Cth1. If two or more of the electrostatic capacitance values Cc, Cr, Cl are equal to or larger than the third threshold value Cth3, the contact determination ECU 30a determines that the passenger H is in contact with the contact sensor.

According to the second embodiment, even if the electrostatic capacitance values Cc, Cr, Cl detected respectively by the sensors 22, 24, 26 when the passenger H contacts the sensors 22, 24, 26 are decreased, since each of the electrostatic capacitance values Cc, Cr, Cl is compared with the third threshold value Cth3 after the first threshold value Cth1 is switched to the third threshold value Cth3 which is smaller than the first threshold value Cth1, it is possible to determine the contact state properly. That is, even when the plurality of sensors 22, 24, 26 are used, the first threshold value Cth1 which is close to the electrostatic capacitance value Ch detected when the passenger H contacts only one contact sensor (any one of the sensors 22, 24, 26) can be changed properly to make the contact determination.

The contact determination ECU 30a sets, as the third threshold value Cth3, a numeric value calculated by dividing the first threshold value Cth1 by the number of electrostatic capacitance values Cc, Cr, Cl that are equal to or more than the second threshold value Cth2. In this system, it is possible to set the threshold value properly, and determine the contact state accurately.

3 Modified Embodiment

In the first embodiment, in the case where all of the electrostatic capacitance values Cc, Cr, Cl are less than the first threshold value Cth1 (step S3: NO), the total value calculation unit 52 of the contact determination ECU 30 sums all of the electrostatic capacitance values Cc, Cr, Cl (step S5). Processing of step S3 (and step S4) performed in the first embodiment may be omitted. That is, the total value calculation unit 52 of the contact determination ECU 30 may sum all of the electrostatic capacitance values Cc, Cr, Cl regardless of each of the electrostatic capacitance values Cc, Cr, Cl. In this case, the process of step S3 is not performed after the process of step S2, and the process of step S5 is performed after the process of step S2. In this case, it is possible to omit the process of determining whether the passenger H contacts only one of the sensors 22, 24, 26 or two or more of the sensors 22, 24, 26.

In the first embodiment, though it is possible to make the contact determination of whether the passenger H is in contact with the steering wheel 12, it is not possible to make the contact position determination. Therefore, the first embodiment and the second embodiment may be carried out in parallel. In this case, the contact determination may be made according to the first embodiment, and the contact position determination may be made according to the second embodiment.

The steering wheel unit according to the present invention is not limited to the above described embodiments. It is a matter of course that various structures can be adopted without deviating from the gist of the present invention.

What is claimed is:

1. A steering wheel unit comprising:
   a plurality of electrostatic capacitance type contact sensors provided for a steering wheel; and
   a contact determination device configured to determine whether a passenger is in contact with the steering wheel based on electrostatic capacitance values detected by the contact sensors and a first threshold value,
   wherein the contact determination device is further configured to compare each of two or more of the electrostatic capacitance values with a second threshold value which is smaller than the first threshold value and larger than zero,
   if two or more of the electrostatic capacitance values are equal to or larger than the second threshold value and are smaller than the first threshold value, the contact determination device switches the first threshold value to a third threshold value which is a numeric value calculated by dividing the first threshold value by the number of the electrostatic capacitance values that are equal to or larger than the second threshold value, and
   if two or more of the electrostatic capacitance values are equal to or larger than the third threshold value, the contact determination device determines that the passenger is in contact with the contact sensors.

2. The steering wheel unit according to claim 1, wherein the first threshold value is a value that is smaller than a value of electrostatic capacitance produced between the one of the contact sensors and the passenger when the passenger contacts one of the contact sensors; and the second threshold value is less than a value calculated by dividing, by the number of the contact sensors, the value of the electrostatic capacitance produced between the one of the contact sensors and the passenger when the passenger contacts one of the contact sensors.

3. The steering wheel unit according to claim 1, wherein the contact detection device detects the electrostatic capacitance values by an integration method or a charge transfer method.

* * * * *